United States Patent
Rossnagel et al.

(10) Patent No.: US 6,238,532 B1
(45) Date of Patent: May 29, 2001

(54) RADIO-FREQUENCY COIL FOR USE IN AN IONIZED PHYSICAL VAPOR DEPOSITION APPARATUS

(75) Inventors: Stephen Mark Rossnagel, Pleasantville; Darryl D. Restaino, Modena; Andrew Herbert Simon, Fishkill; Pavel Smetana, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,831

(22) Filed: Oct. 29, 1999

(51) Int. Cl.[7] .................. C23C 14/40; C23C 16/509; C23C 14/00
(52) U.S. Cl. .................. 204/298.06; 204/298.09; 204/298.05; 118/723 I; 118/723 E; 118/724
(58) Field of Search ............ 204/298.06, 298.09, 204/298.05; 118/723 I, 723 E, 724

(56) References Cited

U.S. PATENT DOCUMENTS

| | | |
|---|---|---|
| 4,135,286 | 1/1979 | Wright et al. . |
| 4,209,375 | 6/1980 | Gates et al. . |
| 5,036,252 * | 7/1991 | Lob .................. 315/111.31 |
| 5,114,556 | 5/1992 | Lamont, Jr. .................. 204/192.12 |
| 5,190,474 | 3/1993 | Ginet .................. 439/581 |
| 5,358,615 | 10/1994 | Grant et al. .................. 204/192.15 |
| 5,490,910 | 2/1996 | Nelson et al. .................. 204/192.15 |
| 5,733,418 | 3/1998 | Hershcovitch et al. .................. 204/192.11 |
| 5,796,315 | 8/1998 | Gordon et al. .................. 333/24 C |
| 5,902,461 * | 5/1999 | Xu et al. .................. 204/192.12 |
| 5,968,327 * | 10/1999 | Kobayashi et al. .................. 204/298.11 |
| 6,063,233 * | 5/2000 | Collins et al. .................. 204/298.09 |

OTHER PUBLICATIONS

"RF Work Coil for Evaporative Deposition System," IBM Technical Disclosure Bulletin, vol. 30, No. 2, pp. 698–699, Jul. 1987.*
J. L. Vossen and W. Kern, eds. "Thin Film Processes" (Academic Press, 1978), p. 31–32 (Month Unknown).
E. Uberbacher, "Multistage Through–hole," IBM Technical Disclosure Bulletin 10,882, Dec. 1967.

* cited by examiner

Primary Examiner—Alan Diamond
(74) Attorney, Agent, or Firm—Jay H. Anderson

(57) ABSTRACT

A cooling structure and a reinforcing structure are described for use with a radio-frequency coil in an ionized physical vapor deposition apparatus. The cooling structure includes a portion for carrying coolant and is proximate to the RF coil along the outer circumference thereof. The cooling structure is shaped relative to the RF coil so that thermal expansion of the RF coil brings the RF coil into close contact with the cooling structure, thereby facilitating heat transfer from the RF coil to the coolant. The reinforcing structure is similarly shaped, and may be integrated with the cooling structure. In addition, the RF coil or cooling/reinforcing structure may be mounted to the wall of the process chamber with telescoping mounting posts, which permit the RF coil to maintain its shape while undergoing thermal expansion. The parasitic inductance of the RF coil leads is reduced by arranging those leads coaxially, thereby minimizing power losses in the RF coil.

18 Claims, 3 Drawing Sheets

RADIO-FREQUENCY COIL FOR USE IN AN IONIZED PHYSICAL VAPOR DEPOSITION APPARATUS

RELATED APPLICATIONS

This application is related to application Ser. Nos. 09/430,829 and 09/430,830 filed the same day and assigned to the same assignee as the present application. The disclosures of these related applications are incorporated herein by reference.

FIELD OF THE INVENTION

This invention relates to improvements in radio-frequency (RF) coils used in ionized physical vapor deposition (IPVD) apparatus, which are widely used in the fabrication of semiconductor devices.

BACKGROUND OF THE INVENTION

Physical vapor deposition (PVD or sputtering) is a well-known process for depositing thin solid films on substrates, and is widely practiced in the semiconductor industry. Ionized physical vapor deposition (IPVD), also referred to as ionized metal plasma (IMP) deposition, has been used more recently to deposit metal films (notably copper) in etched structures such as vias and contact holes. IMP deposition apparatus differs from earlier versions of PVD apparatus in that it requires a metal RF coil in the process chamber in order to generate a plasma which can ionize the metal atoms during the sputter deposition process. The RF coil is, in general, constructed of the same material (with respect to composition and purity) as the sputter target; this is necessary to avoid contamination of the substrate, because sputtering will take place at the coil surface just as at the target surface.

The RF coil is subject to considerable heating due to ion bombardment and high coupled power into the process plasma. The coil temperature may reach 700° C. This in turn causes the temperature of the substrate (typically a semiconductor wafer) to increase; this is not desirable because the substrate temperature cannot be easily controlled. Furthermore, the RF coil is prone to mechanical deformation and premature failure due to the high thermal load. This problem is particularly acute when the coil is constructed of a relatively soft, malleable material such as copper. As shown schematically in FIG. 1, the coil 100 is generally circular in shape with a break in its circumference; the RF voltage is applied across the break through leads 101, 102. Thermal expansion of the coil can cause the ends 111, 112 of the coil to touch, resulting in an electrical short.

There is a need for an RF coil for use in IPVD process apparatus in which excessive heating and deformation are avoided, thereby extending the lifetime of the coil, improving the efficiency and reliability of the IPVD apparatus, and reducing the cost of operating the apparatus in the manufacture of semiconductor devices.

SUMMARY OF THE INVENTION

The present invention addresses the above-described need by providing a cooling structure and/or a reinforcing structure for an RF coil in which deformation of the RF coil due to thermal expansion is reduced or avoided.

In accordance with a first aspect of the present invention, a cooling structure including a portion for carrying coolant is provided for the RF coil; the cooling structure is proximate to the RF coil along the outer circumference thereof. The cooling structure is at a lower temperature than the RF coil, and may have thermal expansion properties different from those of the RF coil. Furthermore, the cooling structure is shaped relative to the RF coil so that thermal expansion of the RF coil causes the RF coil to be in close contact with the cooling structure, thereby facilitating heat transfer from the RF coil to the coolant.

The RF coil also may be demountable from the cooling structure. The cooling structure is shielded by the RF coil from sputtering during the IPVD process.

In accordance with a second aspect of the invention, a reinforcing structure is provided which gives mechanical reinforcement for the RF coil. The reinforcing structure is proximate to the RF coil along the outer circumference thereof. The reinforcing structure and the RF coil are of materials having different thermal expansion properties and are shaped so that thermal expansion of the RF coil causes the RF coil to be in close contact with the reinforcing structure.

Furthermore, the cooling structure may be shaped to provide mechanical reinforcement for the RF coil, so that the cooling structure and the reinforcing structure are integrated.

In accordance with another aspect of the invention, the RF coil (or cooling or reinforcing structure) is mounted on a fixed portion of the IPVD device by a mounting post having a first portion and a second portion slidably connected thereto. This arrangement permits the mounting post to telescope in accordance with thermal expansion of the RF coil. In addition, the mounting post provides electrical insulation between the RF coil and the fixed portion of the PVD device. Specifically, the first portion of the mounting post may be attached to the fixed portion of the PVD device and include an electrical insulator, while the second portion of the mounting post is attached to the RF coil; the electrical insulator mates with the second portion and slides along an interior surface thereof in accordance with the thermal expansion of the RF coil.

In accordance with an additional aspect of the invention, the electrical leads to the RF coil may be fed through the wall of the IPVD device arranged in a coaxial fashion instead of in parallel, thereby reducing the electrical inductance of the leads.

DETAILED DESCRIPTION OF THE PREFERRED EMBODIMENTS

Figure 2A:
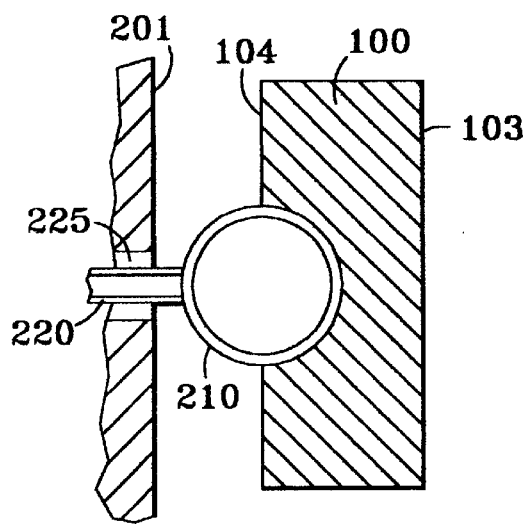
FIG. 2A is a schematic cross-sectional view of an RF coil and cooling ring in accordance with an embodiment of the present invention.

A preferred embodiment of the present invention is shown schematically in FIG. 2A. FIG. 2A is a cross-sectional view of the RF coil 100 and a cooling ring 210 (that is, a tube for carrying coolant and proximate to the RF coil along the outer circumference thereof), located on the inside of the wall 201 of the IPVD process chamber. During the deposition process, surface 103 on the inner circumference of the RF coil is sputtered. Liquid cooling is supplied to the coil by means of cooling ring 210; coolant is supplied to the cooling ring by feedthrough 220, which is connected to an external cooling system (not shown). Since the cooling ring 210 is in contact with the RF coil, the feedthrough 220 is at RF potential and therefore must be insulated from the wall 201 by an insulator 225, as shown schematically in FIGS. 2A and 2B.

Cooling ring 210 is preferably formed of a rigid material such as stainless steel. Cooling ring 210 and RF coil 100 are shaped so that, when heating of the RF coil causes the RF coil to expand, the back side 104 of the RF coil comes into close thermal contact with the cooling ring (as shown in FIG. 2A). If RF coil 100 has a higher thermal expansion coefficient than cooling ring 210, RF coil 100 will then fit snugly against cooling ring 210 as its temperature increases. Even if RF coil 100 and cooling ring 210 are of the same material, the difference in temperature between the RF coil (exposed to the IPVD process) and the cooling ring (carrying the chilled coolant) will result in thermal expansion of the coil with respect to the cooling ring.

Accordingly, thermal expansion of the RF coil during the IPVD process facilitates heat transfer to the liquid coolant, thereby avoiding overheating of the RF coil. The cooling ring is protected from ion bombardment by the front surface 103 of the RF coil. Since the cooling ring is not subject to sputtering, the choice of materials for the cooling ring can be based on mechanical and thermal properties, rather than on compatibility with the sputtering target.

Figure 2B:
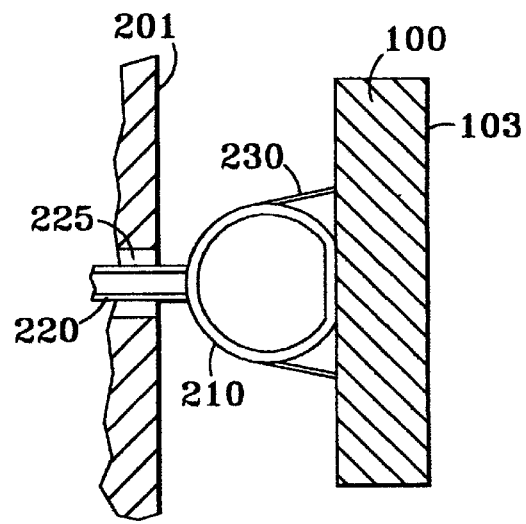
FIG. 2B is a schematic cross-sectional view of an RF coil and cooling ring in accordance with an alternative embodiment of the present invention.

In an alternative embodiment, a rigid fastening 230 may be used to hold the RF coil 100 against the cooling ring 210 to ensure thermal contact therewith, as shown in FIG. 2B. In this arrangement it is not necessary to shape the RF coil to match the cooling ring, so that the cost of machining the RF coil may be less than in the first embodiment.

Figure 3A:
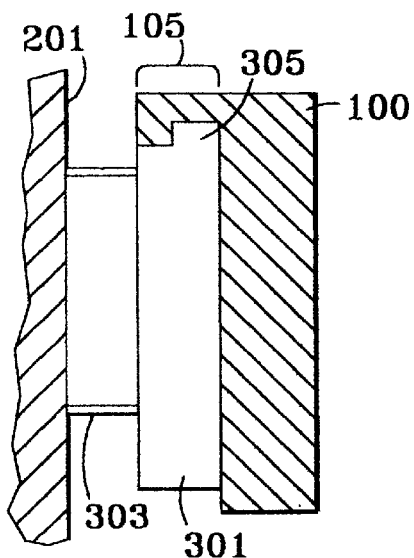
FIGS. 3A and 3B are schematic cross-sectional views of an RF coil and a mechanical reinforcing rib.

It should be noted that the cooling ring, when in close contact with the RF coil, provides desirable mechanical reinforcement to the RF coil (particularly when the cooling ring is a relatively rigid material such as stainless steel and the RF coil is a relatively soft material such as copper). Alternatively, a separate reinforcing rib or hoop may be coupled to the RF coil, as shown schematically in FIGS. 3A–3C. In FIG. 3A, the RF coil 100 and reinforcing rib 301 are shaped so that a portion 105 of the RF coil overhangs and mates with a corresponding portion 305 of rib 301. The RF coil partially encloses the reinforcing rib, and in particular covers those surfaces of the reinforcing rib 301 which otherwise would be subject to ion bombardment. The reinforcing rib is attached to the chamber wall 201 by bolts or mounting posts 303, or more preferably with telescoping mounting posts as described in greater detail below. Since the reinforcing rib 301 is at RF potential, the mounting posts 303 must be capable of providing insulation between the rib 301 and the grounded chamber wall 201.

Figure 3B:
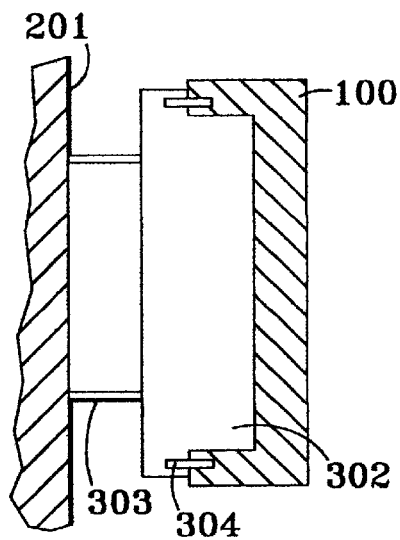

In FIG. 3B, the reinforcing rib 302 is shaped so that the RF coil 100 is easily attached and demounted, for example using bolts 304. This arrangement facilitates changing coils when a coil is consumed or when a different deposition process is desired. In either of these two arrangements, deformation and premature failure of the coil is avoided, and the reliability of the IPVD process is therefore improved, leading in turn to better process control and reduced manufacturing cost.

Although stainless steel is the preferred material for the reinforcing rib, any material may be used which is different from that of the RF coil and relatively more rigid and non-deformable (for example, titanium when a copper RF coil is used).

Figure 3C:
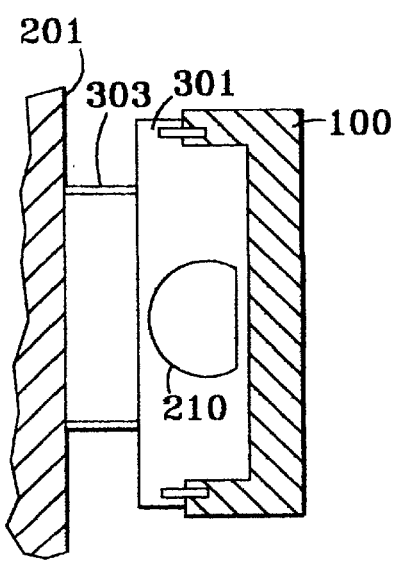
FIG. 3C is a schematic cross-sectional view of an RF coil with an integrated cooling ring and mechanical reinforcing rib.

It will be appreciated that the cooling ring 210 may be integrated with the reinforcing rib; one possible arrangement is shown in FIG. 3C.

Figure 4A:
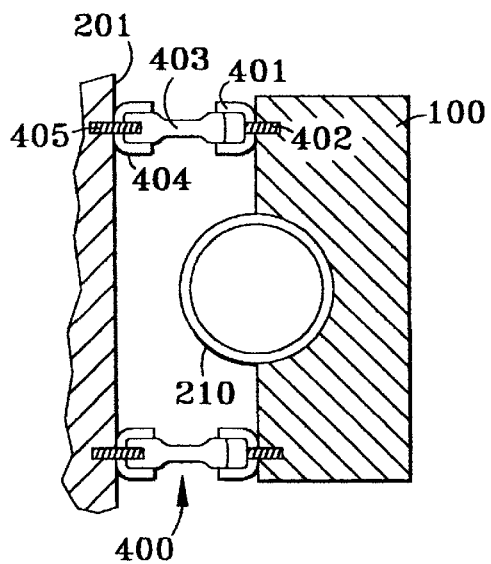
FIGS. 4A and 4B are schematic cross-sectional views of an RF coil and reinforcing rib with telescoping mounting posts.
Figure 4B:
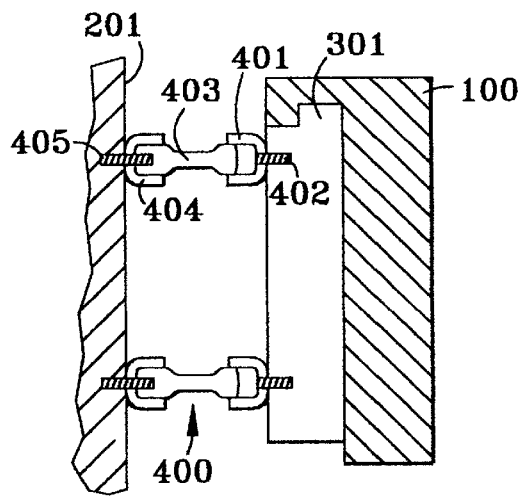
Figure 4C:
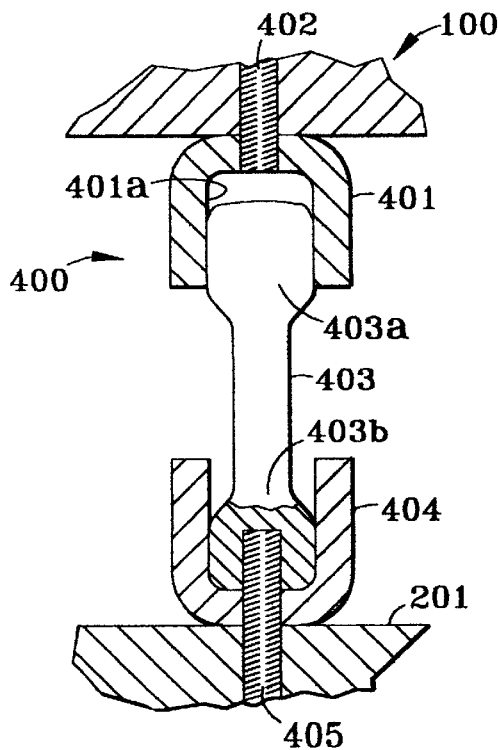
FIG. 4C is a detail cross-sectional view of a telescoping mounting post shown in FIGS. 4A and 4B.

As the RF coil 100 heats and expands relative to the process chamber, the coil tends to move closer to the chamber wall 201. Conventional rigid mounting posts force the coil to expand at the open ends 111, 112, resulting in electrical shorting. This problem can be overcome by mounting the coil on telescoping mounting posts 400, as shown in FIGS. 4A–4C. (In FIG. 4A, RF coil 100 is shown in contact with cooling ring 210, but without an additional mechanical reinforcing structure.) RF coil 100 is attached to a cup-shaped support 401 by bolt 402. A similar cup-shaped support 404 is attached to the wall 201 of the process chamber by bolt 405. An electrically insulating post 403 is captured in supports 401 and 404 at its two ends 403a and 403b. As best shown in FIG. 4C, one end 403b of the post 403 is attached to support 404 and the wall 201 of the process chamber, while the other end 403a is free to slide inside support 401, along interior surface 401a. This permits mounting post 400 to elongate or contract as RF coil 100 moves away from or toward wall 201. With this arrangement, the RF coil is free to expand outward toward the wall of the process chamber, and thus retain its proper shape, as its temperature increases. An alternative arrangement, where the telescoping mounting posts are used with a reinforcing rib for the RF coil, is shown in FIG. 4B.

Figure 1:
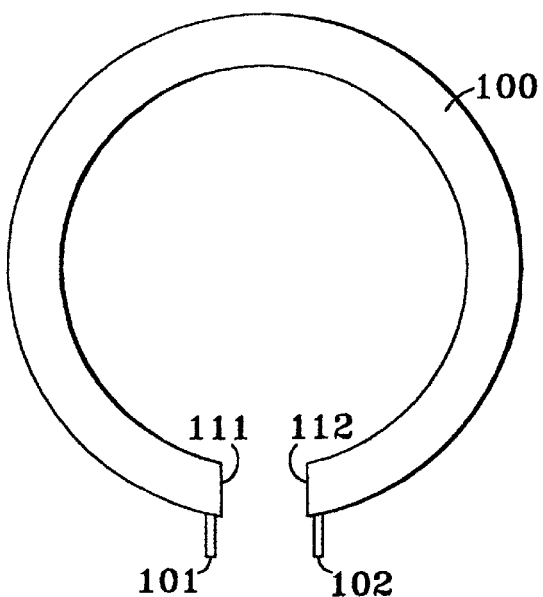
FIG. 1 is a schematic plan view showing the shape of an RF coil used in a typical ionized physical vapor deposition (IPVD) apparatus.
Figure 5:
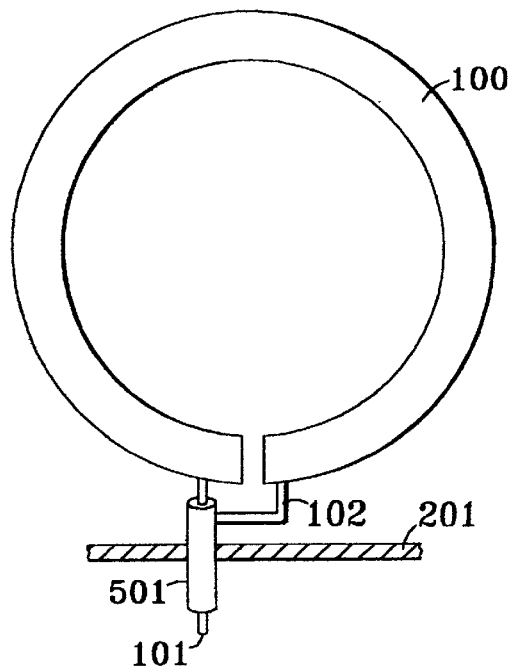
FIG. 5 is a schematic plan view of an RF coil with a coaxial arrangement for the leads thereof.

It should be noted that heating of the RF coil can be reduced by minimizing losses in delivery of power to the coil. A typical IPVD apparatus uses unshielded parallel leads 101, 102 (see FIG. 1), which inherently have a parasitic inductance. This results in power loss and a less efficient IPVD process, since the total RF power is not delivered to the coil 100. The power lost to the parasitic inductance also causes unwanted heating of the leads 101, 102. This loss can be minimized by attaching the ground lead 102 to a coaxial shield 501 surrounding the powered lead 101, as shown schematically in FIG. 5. The coaxial shield 501 is incorporated in the feedthroughs in the chamber wall 201. This arrangement reduces the parasitic inductance and power loss and causes the total RF power delivered to the coil to be more reproducible, and thus has the added advantage of enabling greater control of the deposition process.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. An apparatus for use in a physical vapor deposition (PVD) device having a radio-frequency (RF) coil with an outer circumference facing an inner wall of the PVD device, the apparatus comprising:

a cooling structure including a portion for carrying coolant, the cooling structure being proximate to the RF coil along the outer circumference thereof, wherein the cooling structure is at a lower temperature than the RF coil, and is shaped relative to the RF coil so that thermal expansion of the RF coil causes the RF coil to be in close contact with the cooling structure, thereby facilitating heat transfer from the RF coil to the coolant.

2. An apparatus according to claim 1, wherein the cooling structure has thermal expansion properties different from the RF coil.

3. An apparatus according to claim 1, wherein the cooling structure is shaped to provide mechanical reinforcement for the RF coil.

4. An apparatus according to claim 1, wherein the RF coil is demountable from the cooling structure.

5. An apparatus according to claim 1, wherein the cooling structure is shielded by the RF coil from sputtering during a PVD process.

6. An apparatus according to claim 1, further comprising:

a mounting post for mounting the RF coil to a fixed portion of the PVD device, said mounting post having a first portion and a second portion slidably connected thereto, thereby permitting the mounting post to telescope in accordance with thermal expansion of the RF coil, said mounting post providing electrical insulation between the RF coil and the fixed portion of the PVD device.

7. An apparatus according to claim 6, wherein the first portion of the mounting post is attached to the fixed portion of the PVD device and includes an electrical insulator, the second portion of the mounting post is attached to the RF coil, and said electrical insulator mates with said second portion and slides along an interior surface thereof in accordance with the thermal expansion of the RF coil.

8. An apparatus according to claim 1, wherein the PVD device has a feedthrough in a wall thereof for electrical leads connected to the RF coil including a first electrical lead and a second electrical lead, the apparatus further comprising:

a conducting shield connected to the first electrical lead, surrounding the second electrical lead and coaxial therewith, and in electrical contact with the wall of the PVD device, so that the electrical inductance of the leads is less than the electrical inductance of the leads when arranged in parallel.

9. An apparatus for use in a physical vapor deposition (PVD) device, comprising:

a radio-frequency (RF) coil, having an inner circumference and an outer circumference facing an inner wall of the PVD device;

a reinforcing structure for providing mechanical reinforcement for the RF coil, the reinforcing structure being proximate to the RF coil along the outer circumference thereof, and the reinforcing structure and the RF coil are of materials having different thermal expansion properties and are shaped so that thermal expansion of the RF coil causes the RF coil to be in close contact with the reinforcing structure; and a mounting post for mounting the RF coil to a fixed portion of the PVD device, said mounting post having a first portion and a second portion slidably connected thereto, thereby permitting the mounting post to telescope in accordance with thermal expansion of the RF coil, said mounting post providing electrical insulation between the RF coil and the fixed portion of the PVD device.

10. An apparatus according to claim 9, wherein the RF coil is demountable from the reinforcing structure.

11. An apparatus according to claim 9, wherein the RF coil shields the reinforcing structure from sputtering during a PVD process.

12. An apparatus according to claim 9, wherein the reinforcing structure includes a cooling portion for carrying coolant to facilitate heat transfer from the RF coil.

13. An apparatus according to claim 9, wherein the first portion of the mounting post is attached to the fixed portion of the PVD device and includes an electrical insulator, the second portion of the mounting post is attached to the RF coil, and said electrical insulator mates with said second portion and slides along an interior surface thereof in accordance with the thermal expansion of the RF coil.

14. An apparatus according to claim 9, wherein the PVD device has a feedthrough in a wall thereof for electrical leads connected to the RF coil including a first electrical lead and a second electrical lead, the apparatus further comprising:

a conducting shield connected to the first electrical lead, surrounding the second electrical lead and coaxial therewith, and in electrical contact with the wall of the PVD device, so that the electrical inductance of the leads is less than the electrical inductance of the leads when arranged in parallel.

15. A mounting post for mounting a radio-frequency (RF) coil structure to a fixed portion of a physical vapor deposition (PVD) device, comprising:

a first portion attached to the fixed portion of the PVD device and including an electrical insulator; and a second portion attached to the RF coil structure and slidably connected to the electrical insulator, so that the first portion and the second portion telescope with respect to each other in accordance with thermal expansion of the RF coil structure.

16. A mounting post according to claim 15, wherein said electrical insulator mates with said second portion and slides along an interior surface thereof in accordance with the thermal expansion of the RF coil.

17. A mounting post according to claim 15, wherein the RF coil structure includes an RF coil and a cooling portion for carrying coolant to facilitate heat transfer from the RF coil.

18. A mounting post according to claim 15, wherein the RF coil structure includes an RF coil and a reinforcing structure for mechanical reinforcement of the RF coil, and the second portion of the mounting post is attached to the reinforcing structure.

* * * * *